United States Patent
Taniguchi et al.

[11] Patent Number: 5,949,465
[45] Date of Patent: Sep. 7, 1999

[54] THERMAL PRINTHEAD, SUBSTRATE FOR THE SAME AND METHOD FOR MAKING THE SUBSTRATE

[75] Inventors: Hideo Taniguchi; Shinobu Obata; Hiroshi Kinoshita, all of Kyoto, Japan

[73] Assignee: Rohm Co., Ltd., Kyoto, Japan

[21] Appl. No.: 08/750,377

[22] PCT Filed: Jun. 19, 1995

[86] PCT No.: PCT/JP95/01216

§ 371 Date: Dec. 6, 1996

§ 102(e) Date: Dec. 6, 1996

[87] PCT Pub. No.: WO95/35213

PCT Pub. Date: Dec. 28, 1995

[30] Foreign Application Priority Data

| Jun. 21, 1994 | [JP] | Japan | 6-138573 |
| Jul. 29, 1994 | [JP] | Japan | 6-179237 |
| Apr. 20, 1995 | [JP] | Japan | 7-095098 |
| Apr. 20, 1995 | [JP] | Japan | 7-095099 |

[51] Int. Cl.$^6$ .................................................. B41J 2/335
[52] U.S. Cl. ............................................................ 347/205
[58] Field of Search .................................. 347/205, 200, 347/201, 202

[56] References Cited

U.S. PATENT DOCUMENTS 4,742,362  5/1988  Takoshima et al. ...................... 346/76
5,357,271  10/1994  Wiklof et al. ............................ 347/207

FOREIGN PATENT DOCUMENTS

| 0 605 190 A2 | 7/1994 | European Pat. Off. | B41J 2/335 |
| 3906484 | 9/1990 | Germany | 347/205 |
| 57-64576 | 4/1982 | Japan | B41J 3/20 |
| 59-83682 | 5/1984 | Japan | 347/205 |
| 60-13565 | 1/1985 | Japan | B41J 3/20 |
| 60-6478 | 1/1985 | Japan | B41J 3/20 |
| 61-254362 | 11/1986 | Japan | B41J 3/21 |
| 62-95240 | 5/1987 | Japan | B41J 3/20 |
| 2-45163 | 2/1990 | Japan | B41J 2/335 |
| 3-290268 | 12/1991 | Japan | B41J 2/335 |
| 5-177854 | 7/1993 | Japan | 347/205 |
| 6-166197 | 6/1994 | Japan | 347/202 |

*Primary Examiner*—Huan Tran
*Attorney, Agent, or Firm*—Michael D. Bednarek; Crowell & Moring LLP

[57] ABSTRACT

A thermal printhead according to the present invention includes a substrate (2) of an insulating material, a heating resistor (3) formed on the substrate (2) to form a plurality of heating dots, a conductor pattern (5, 6) formed on the substrate (2) for electrical connection to the heating resistor (3), and driving elements mounted on the substrate (2) for selectively heating the heating dots via the conductor pattern (5, 6). The substrate (2) has, at the position of the heating resistor (3), a raised portion (2a) and the substrate (2) has, in its wall thickness at the position of the raised portion (2a), a hollow portion (10) extending along the heating resistor (3). The present invention also provides a method for making the substrate (2).

17 Claims, 6 Drawing Sheets ion, the amount of heat which is dissipated into the atmosphere via the substrate 102 and the heat sink plate 101 will increase, consequently failing to
THERMAL PRINTHEAD, SUBSTRATE FOR THE SAME AND METHOD FOR MAKING THE SUBSTRATE

TECHNICAL FIELD

The present invention relates to a thermal printhead, especially to a thermal printhead with a needed power performance improved. Further, the present invention also relates to a substrate for such a thermal printhead and a method for making the substrate.

BACKGROUND ART

Thermal printheads have been widely used for printers of office automation machines such as facsimile machines, for printers of ticket vending machines and for label printers. As is commonly known, the thermal printhead selectively provides heat to a printing medium such as thermosensitive paper or thermal-transfer ink ribbon to form needed image information.

For the convenience of explanation, the structure of a typical prior art thick film-type thermal printhead is shown in FIG. 12 of the accompanying drawings. The thermal printhead 100 shown in that figure comprises a solid insulating substrate 102 made of e.g. a ceramic material and fixed on a heat sink plate 101 which is made of a metal such as aluminum having a high thermal conductivity. The upper surface of the substrate 102 is formed with a glass glaze layer 103 as a heat retention member, and a heating resistor 104 is formed linearly on top of the glaze layer 103 to provide an array of heating dots. Further, the upper surface of the substrate 102 is provided with a plurality of drive ICs 105 for supplying electric power to the heating resistor 104.

Further, the substrate 102 carries a common electrode 106 extending on the glaze layer 103 and having comb-like teeth in conduction with the heating resistor 104, and a plurality of individual electrodes 107 similarly extending on the glaze layer 103 and electrically connected to the heating resistor 104. The individual electrodes 107 are connected to the drive ICs 105 via bonding wires 108. The heating resistor 104, the common electrode 106 and the individual electrodes 107 are covered with a protective layer 109 made of a glass material for example.

In the thermal printhead having the above-described arrangement, a predetermined voltage is selectively supplied from the drive ICs 105 via the individual electrodes 107 while the voltage of the common electrode 106 is kept at a constant value, thereby selectively actuating the heating dots of the heating resistor 104 to thermally form images on thermosensitive paper for example.

Generally, it is necessary to enhance the heat retaining ability near the heating resistor 104 in order to improve the printing performance with a small electrical power. For this purpose, in the prior art thermal printhead described above, the glaze layer 103 formed below the heating resistor 104 provides a heat retaining function. On the other hand, a portion of the heat from the heating resistor 104 which has already escaped to the substrate 102 is no longer utilizable for printing. Thus, the heat sink plate 101 serves to quickly dissipate the escaped heat into the atmosphere for preventing a temperature rise of the substrate 102 as a whole.

However, in the prior art thermal printhead described above, since the glaze layer 103 alone cannot provide a sufficient heat retaining function, the amount of heat which is dissipated into the atmosphere via the substrate 102 and the heat sink plate 101 will increase, consequently failing to provide a satisfactory printing performance when the supplied power is reduced below a predetermined level.

On the other hand, with a recent development of various office automation machines, there is an increasing demand for portable thermal printers of battery drive type (i.e., low power consumption type). However, the above-described prior art thermal printhead is not suitable for constituting a portable thermal printer of battery drive type (i.e., low power consumption type).

In order to overcome such a problem, Japanese Patent Publication No. 3(1991)-21352 for example proposes formation of a hollow portion 110 (shown by the phantom lines in FIG. 9) in the glaze layer 103 to additionally increase heat retention near the heating resistor 104. The hollow portion 110 may be formed, for example, by the steps of forming a strip-like dissolvable layer (of e.g. silver) on the substrate 102, forming a glaze layer 103 to cover the dissolvable layer, and then dissolving the dissolvable layer with a chemical solution.

However, the above-described solution has a cost increase problem because the steps of forming the hollow portion 110 (formation and removal of the dissolvable layer) are troublesome.

Further, since the formation of the hollow portion 110 needs the presence of the glaze layer 103 as a prerequisite, it is impossible to form such a hollow portion 110 if the substrate 102 itself is formed of a material having a low thermal conductivity for power consumption decrease to obviate the need for a glaze layer 103. Moreover, since the size and like of the hollow portion 110 are restricted by the thickness and like of the glaze layer 103 for example, the range of realizable printing performance is also greatly limited.

DISCLOSURE OF THE INVENTION

An object of the present invention is to provide a thermal printhead which can overcome the problems described above.

Another object of the present invention is to provide a substrate suitable for such a thermal printhead.

Sill another object of the present invention is to provide an advantageous method for making such a substrate.

According to a first aspect of the present invention, there is provided a thermal printhead comprising a substrate of an insulating material, heating resistor means formed on the substrate to form a plurality of heating dots, a conductor pattern formed on the substrate for electrical connection to the heating resistor means, and driving means for selectively heating the heating dots via the conductor pattern, wherein the substrate has a raised portion at a position of the heating resistor means, and the substrate further has, in its wall thickness, a hollow portion extending along the heating resistor means at a position of the raised portion.

With the arrangement described above, since the hollow portion can provide an enhanced heat retaining ability adjacent the heating resistor means to prevent heat dissipation to the substrate, power consumption can be greatly reduced in comparison with the conventional thermal printhead which has no hollow portion. Therefore, the thermal printhead with the arrangement described above is suitable for constituting a battery-driven portable thermal printer. In addition, since the hollow portion is formed in the wall thickness of the substrate at the position of the raised portion, there are less limitations on the size and configuration of the hollow portion in comparison with the conventional arrangement wherein the hollow portion is formed in the glaze layer, thereby making it possible to correspondingly widen the range of realizable printing performance while also reducing the size due to the omission of the glaze layer.

The raised portion (the hollow portion) may have a trapezoidal or arcuate cross section. The hollow portion may have cross-sectionally different-configured upper region (trapezoidal for example) and lower region (rectangular for example). The substrate is advantageously made of a homogeneous mixture of alumina and a glass material.

According to a preferred embodiment of the present invention, the heating resistor means and the conductor pattern are covered by protective means, and the protective means has, at the position of the heating resistor means, a higher thermal conductivity than the substrate. In this case, the protective means preferably comprises first protective layers covering the conductor pattern on both sides of of the heating resistor means and having a lower thermal conductivity, and a second protective layer covering the heating resistor means and having a higher thermal conductivity. With such an arrangement, it is possible to increase heat conduction to a printing medium (thermosensitive paper for example) at the position of the heating resistor means, while heat dissipation can be reduced at other positions. Thus, it is possible to further reduce the power needed for printing. The second protective layer may be formed of a material containing a filler for improving thermal conductivity for example.

According to a second aspect of the present invention, there is provided a substrate of an insulating material for a thermal printhead, wherein the substrate has, on a surface thereof, a longitudinal raised portion and the substrate has, in its wall thickness, a hollow portion extending longitudinally of the raised portion at a position of the raised portion.

According to a third aspect of the present invention, there is provided a method for making a substrate for a thermal printhead by laminating and baking a plurality of green sheets comprising the steps of: preparing a surface green sheet formed with at least one raised portion defining a dent, while also preparing at least one base-forming green sheet; laminating the surface green sheet and the base-forming green sheet so that the dent faces the base-forming green sheet; and baking the obtained laminate.

According to the method described above, the hollow portion can be formed in the wall thickness of the substrate at the position of the raised portion simply by laminating and baking the two kinds of green sheets. Thus, it is possible to avoid the conventionally required, troublesome steps of forming and removing a dissolvable layer. Therefore, it is possible to greatly reduce the cost for manufacturing the substrate, namely thermal printhead.

Preferably, the surface green sheet and the base-forming green sheet contain alumina, a glass material and a thermoplastic resin which evaporates by thermal decomposition at said baking temperature. In this case, the thermoplastic resin serves as a binder to bond the green sheets to each other, but will evaporate for dissipation by thermal decomposition at the time of baking. The formation of the raised portion defining the dent may be performed by pressing the surface green sheet with the use of a die having a recess and a die having a projection.

According to a preferred embodiment of the method of the present invention, the laminating step is performed with at least one perforated green sheet sandwiched between the surface green sheet and the base-forming green sheet, wherein the perforated green sheet has a slit which corresponds to the dent of the surface green sheet. Thus, it is possible to increase the height of the hollow portion by an amount of the thickness of the slit of the perforated green sheet.

According to another preferred embodiment of the method of the present invention, the laminating and baking steps are performed with a thermally decomposable resin fitted in the dent of the surface green sheet. Thus, it is possible to prevent deformation of the hollow portion during the laminating and baking steps. In addition, the thermally decomposable resin itself evaporates and dissipates by thermal decomposition due to the heat given in the baking step, thereby preventing the printing performance from deteriorating.

Considering a desired thickness and the like of the substrate, a plurality of base-forming green sheets are used in practice. In this case, a base laminate body is prepared by laminating a plurality of base-forming green sheets, a surface green sheet is laminated on the base laminate body, and the resulting combined laminate body is baked.

Other features and advantages of the present invention will be clearer from the detailed explanation of the embodiments described below with reference to the accompanying drawings.

BEST MODE FOR CARRYING OUT THE INVENTION

The preferred embodiments of the present invention will be described below with reference to the accompanying drawings.

Figure 1:
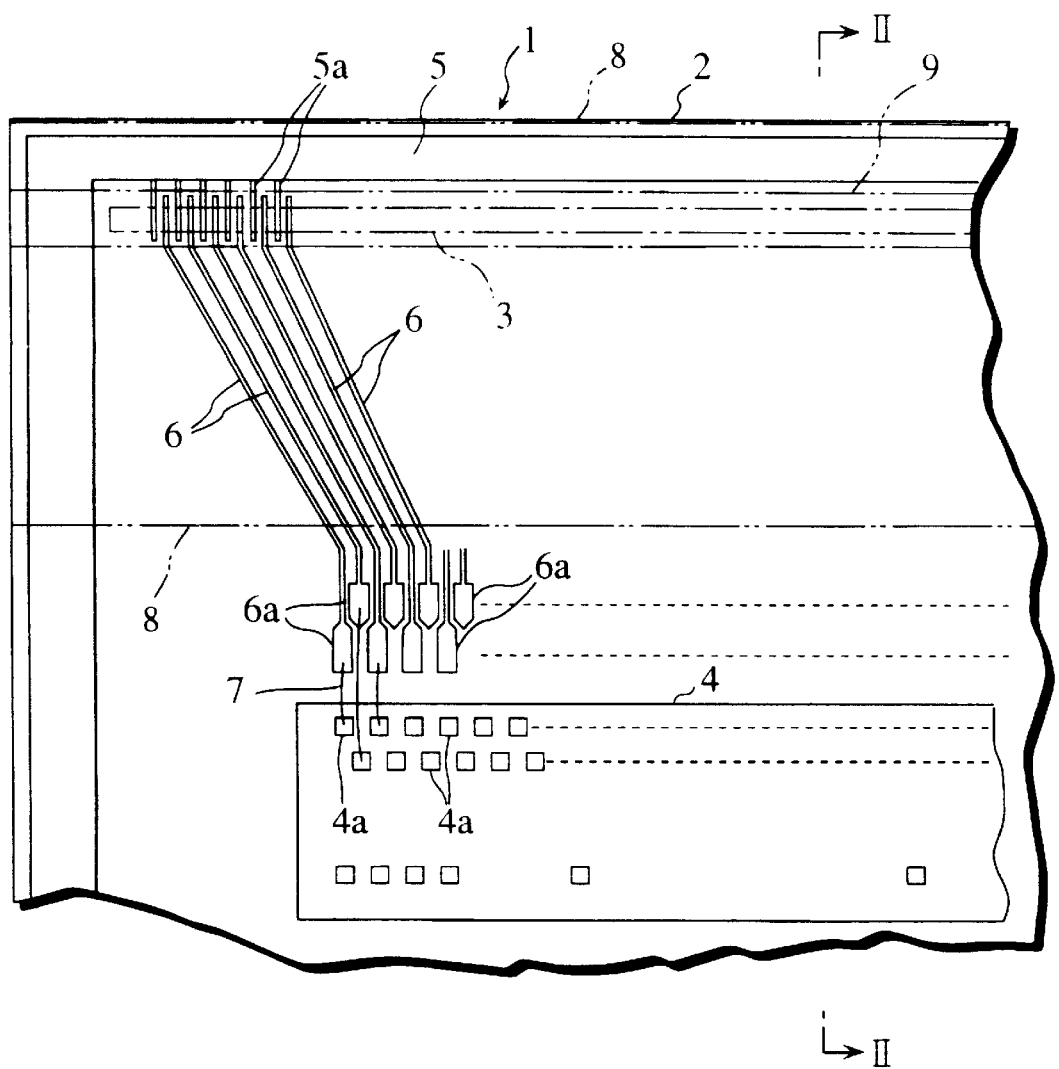
FIG. 1 is a fragmentary plan view showing a principal part of a thermal printhead according to a preferred embodiment of the present invention.
Figure 2:
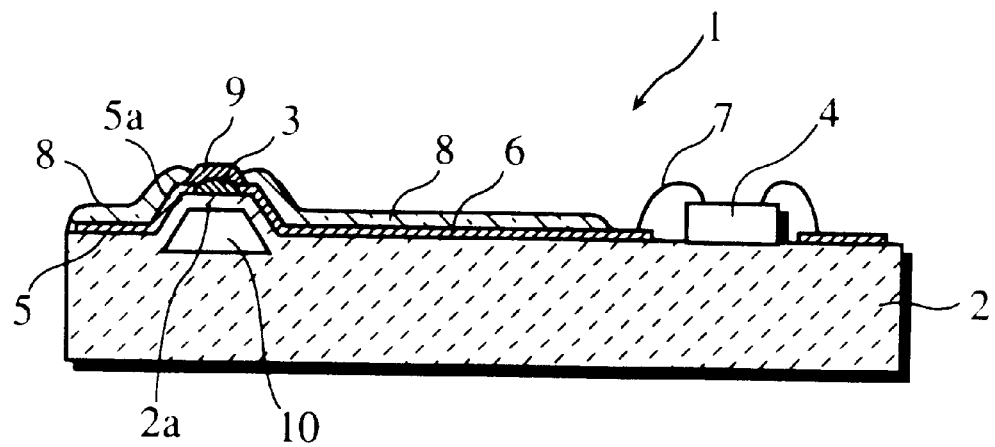
FIG. 2 is a sectional view taken on lines II—II in FIG. 1.
Figure 4:
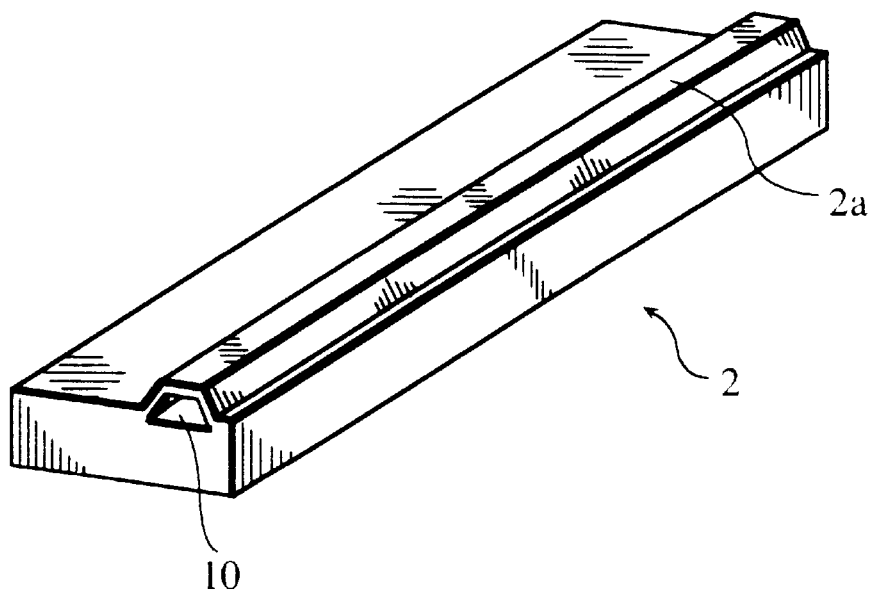
FIG. 4 is a perspective view showing a substrate used for the thermal printhead illustrated in FIGS. 1 and 2.

In FIGS. 1, 2 and 4, a thermal printhead according to a first embodiment of the present invention is generally indicated by reference number 1. The thermal printhead 1 includes a strip-like head substrate 2 (see FIG. 4) which is made of an insulating material such as a mixture of alumina and borosilicate glass (referred to as "ceramic glass" or "crystallized glass").

The upper surface of the substrate 2 has a heating resistor 3 formed along one longitudinal edge of the substrate 2 by linearly printing a paste of resistor material such as ruthenium oxide for example. In addition, the upper surface of the substrate 2 is provided with a plurality of drive ICs 4 (only one shown in FIG. 1) which actuate the heating resistor 3 for divisional driving in the longitudinal direction as well as with a conductor pattern. While the heating resistor 3 is formed as a thick film in the illustrated embodiment, it may be formed as a thin film. Further, instead of mounting the drive ICs 4 directly on the head substrate 2, the head substrate 2 may be carried on a separately provided supporting substrate (not shown) on which the drive ICs 4 may be mounted.

The conductor pattern on the upper surface of the substrate 2 includes a common electrode 5 extending between the above-mentioned one longitudinal edge of the substrate 2 and the heating resistor 3, and a multiplicity of individual electrodes 6 extending from the heating resistor 3 toward the respective drive ICs 4. The common electrode 5 has a multiplicity of comb-like teeth 5a which intersect the heating resistor 3 and are constantly spaced longitudinally of the heating resistor 3. One end of each individual electrode 6 intersects the heating resistor 3 between the comb-like teeth 5a of the common electrode 5. On the other hand, the other end of each individual electrode 6 is formed with a connecting pad 6a for electrical connection to an output pad 4a of the corresponding drive IC 4 by bondwire 7. Therefore, when driving signals are selectively fed to the individual electrodes 6, an electric current passes selectively through relevant portions (heating dots) of the heating resistor 3 which are sectioned by the comb-like teeth 5a of the common electrode 5, thereby performing a desired printing operation.

In the illustrated embodiment, first protective layers 8 having a low thermal conductivity are formed on the substrate 2 to cover the common electrode 5 and the individual electrodes 6, respectively, on both sides of the heating resistor 3. Further, a second protective layer 9 having a high thermal conductivity is formed to cover the upper surface of the heating resistor 3.

The first protective layers 8 are preferably made of a glass material containing silicate glass as a main constituent. Such a glass material is commercially available as overcoat glass and has a low thermal conductivity of about 1.3 w/m.K. However, the first protective layers 8 may be made of other insulating protective material having a lower thermal conductivity (not larger than 5 w/m.K for example) than the second protective layer 9.

On the other hand, the second protective layer 9 is made of a protective material whose thermal conductivity is larger (e.g. 20–100 w/m.K, preferably 30–50 w/m.K) than the first protective layers 8. Examples of protective material having such a high thermal conductivity include a heat-resistant material containing alumina ($Al_2O_3$) as a main component, a glass material prepared by mixing a conventional silicate glass (overcoat glass) with a thermal conductivity enhancing filler, and a ceramic material prepared by mixing silicon dioxide ($SiO_2$) with a thermal conductivity enhancing filler. Examples of thermal conductivity enhancing filler include alumina (100% alumina) having a thermal conductivity of about 36 w/m.K, aluminum nitride (AlN) having a thermal conductivity of about 60–250 w/m.K, and silicon carbide (SiC) having a thermal conductivity of about 260 w/m.K. In this case, the amount of added filler is suitably determined depending for example on the kind of selected filler and the required printing performance.

Further, as shown in FIGS. 2 and 4, the substrate 2 has a raised portion 2a, and a strip-like hollow portion 10 is formed in the wall thickness of the substrate 2 at the position of the raised portion 2a. In the illustrated first embodiment, the hollow portion 10 has a trapezoidal cross section and communicates with the atmosphere at the both ends (see FIG. 4). The heating resistor 3 is made in a strip form along top of the raised portion 2a. The comb-like teeth 5a of the common electrode 5 and the individual electrodes 6 extend toward the top of the raised portion 2a.

With the thermal printhead 1 having the arrangement described above, the second protective layer 9 having a high thermal conductivity (e.g. 30–50 w/m.K) enhances heat transmission immediately above the heating resistor 3, whereas the first protective layers 8 having a low thermal conductivity (e.g. not greater than 5 w/m.K) remarkably reduces heat dissipation on the both sides of the heating resistor 3. Therefore, the heat generated by the heating resistor 3 can be effectively utilized for heating a printing medium (e.g. thermosensitive paper) held in contact with the second protective layer 9.

Figure 3A:
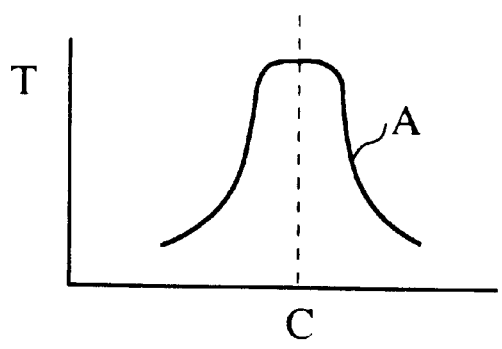
FIG. 3a is a graph showing the temperature distribution of the same thermal printhead in operation.

FIG. 3a is a graph which schematically shows the temperature distribution of the above-described thermal printhead 1 in operation. In FIG. 3a, the abscissa represents the distance from the center C of the heating resistor 3, whereas the ordinate represents the temperature. As indicated by curve A in FIG. 3a, the temperature rises sharply at the second protective layer 9 having a high thermal conductivity, whereas there is a sharp temperature drop at the first protective layers 8 having a low thermal conductivity. Thus, it can be appreciated that the thermal printhead 1 according to the present invention exhibits an excellent printing performance by effectively utilizing the heat generated by the heating resistor 3.

Figure 3B:
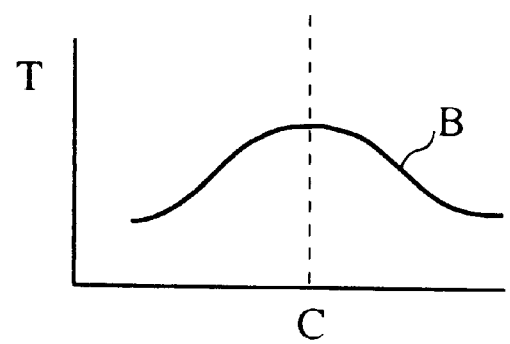
FIG. 3b is a graph showing the temperature distribution of a slightly modified version of the thermal printhead for purposes of comparison.

FIG. 3b is a graph which schematically shows the temperature distribution of a comparative thermal printhead in operation, wherein a single protective layer having a high thermal conductivity covers not only the heating resistor 3 but also the common electrode 5 and individual electrodes 6. As indicated by curve B in FIG. 3b, the temperature of the heating resistor 3 rises gently because heat dissipation is accelerated also above the common electrode 5 and individual electrodes 6, consequently failing to provide a sharp printing quality.

Below the heating resistor 3, on the other hand, the strip-like hollow portion 10 located immediately under the heating resistor 3 remarkably reduces heat transmission to the substrate 2 and heat dissipation from the substrate 2. As a result, the heat (i.e. electric power) needed for performing a desired printing operation can be reduced, so that the substrate 2 with the hollow portion 10 is particularly suitable for constituting a portable battery-driven thermal printhead wherein power consumption is greatly restricted. Further, the above-described thermal printhead 1 is also suitable for forming large size dots with a small power supply. In addition, since the hollow portion 10 is formed in the raised portion 2a on the surface of the substrate and the heating resistor 3 is formed on top of the raised portion 2a, the heating resistor 3 can be raised in height without forming a separate glaze layer, thereby providing a suitable contact with a platen (not shown).

The above-described thermal printhead 1 may be conveniently manufactured by the following process.

Figure 5:
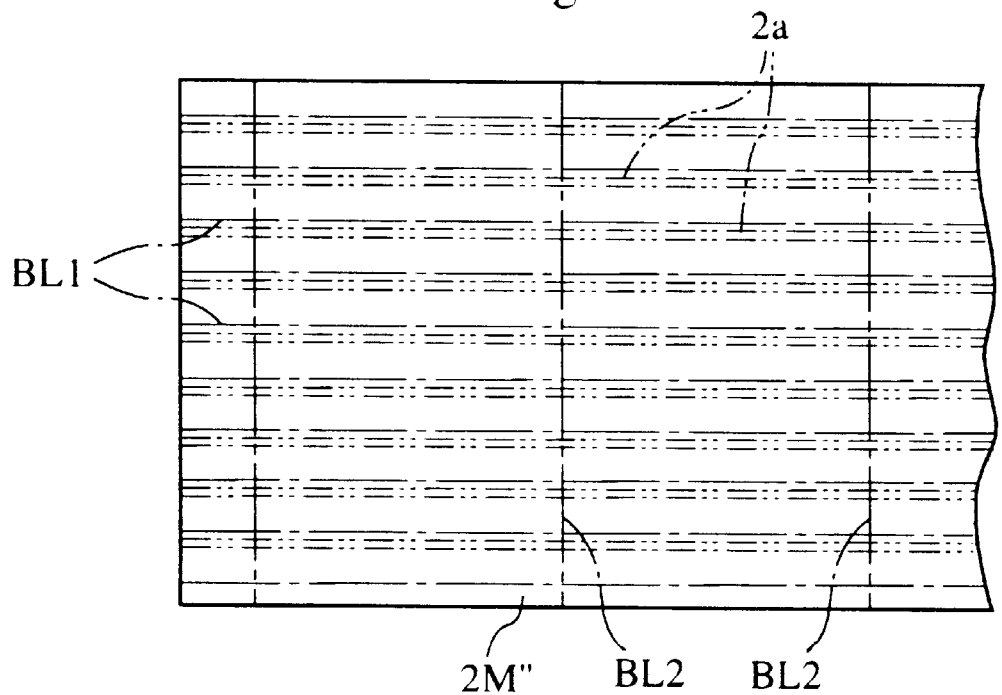
FIG. 5 is a plan view showing a surface green sheet used for making the substrate of FIG. 4.

First, as shown in FIG. 5, there is prepared a flat surface green sheet 2M having a thickness of 0.05mm, and predetermined length and thickness. The size of the surface green sheet 2M is so arranged that when the same sheet is divided along the longitudinal break lines BL1 and the widthwise break lines BL2, each of the divided sections corresponds to a unit head substrate 2 (see FIG. 4) in size. The composition of the surface green sheet 2M, in proportion by weight, is about 35% of powdered alumina, about 35% of borosilicate glass and about 30% of thermoplastic resin (preferably polyvinylbutyral resin). However, the thermoplastic resin used for the green sheets is not limited to polyvinylbutyral resin. Any resin is applicable as long as the resin, like polyacryl resin, softens to become adherent when heated to a temperature of about 80–100° C., and evaporates by thermal decomposition when heated at a higher temperature of about 500° C.

Figure 6A:
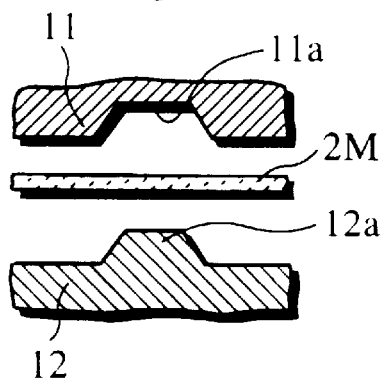
FIGS. 6a–6d are sectional views showing a sequence of a method for making the substrate of FIG. 4.

Then, as shown in FIG. 6a, the surface green sheet 2M is inserted between a first upper die 11 and a first lower die 12. The first upper die 11 has a plurality of longitudinal recesses 11a (only one is illustrated) extending in parallel to each other, whereas the first lower die 12, correspondingly to the recesses 11a, has a plurality of longitudinal projections 12a extending in parallel to each other (only one is illustrated). The recess 11a and the projection 12a are arranged to have a trapezoidal cross section, corresponding to the hollow portion to be formed in the unit head substrate 2.

Figure 6B:
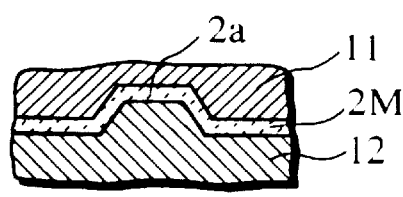

Then, as shown in FIG. 6b, the upper die 11 is lowered toward the lower die 12, so that the surface green sheet 2M is kept at a temperature of about 90° C. under compression of about 200kg/cm$^2$ for about 5 minutes. As a result, as indicated by phantom lines in FIG. 5, a plurality of raised portions 2a extending in parallel to each other are formed in the surface green sheet 2M. The compression force, heating temperature and compression (heating) time may be suitably varied within the ranges of 150–250kg/cm$^2$, 80–110° C. and 5–30 minutes, respectively.

Figure 6C:
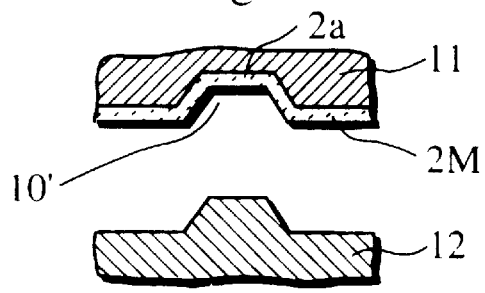

Then, as shown in FIG. 6c, the processed surface green sheet 2M, while kept closely attached to the upper die 11, is raised of the lower die 12 by raising knockout pins (not shown) from the lower die 12. At this time, a dent 10' is formed in the surface green sheet 2M at the position corresponding to the projection of the lower die 12.

Figure 6D:
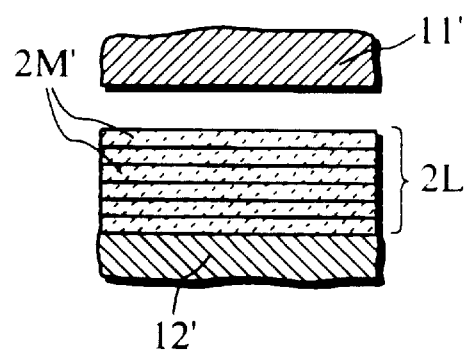

Then, as shown in FIG. 6d, a plurality of separately prepared base-forming green sheets 2M' in a laminated state are inserted between a second upper die 11' and a second lower die 12', and kept at a temperature of about 90° C. under compression of about 200kg/cm$^2$ for about 30 minutes. Each of the base-forming green sheets 2M' has the same composition, thickness and length as those of the surface green sheet 2M. However, the surface green sheet 2M is slightly reduced in width due to the formation of the raised portion 2a (FIGS. 6a–6c). Thus, for purposes of conforming to the reduced width, the width of each base-forming green sheet 2M' is set to be slightly smaller than that of the surface green sheet 2M which is not yet treated for formation of the raised portion 2a. The second upper die 11' and the second lower die 12' have a flat compression surface as a whole.

In the step shown in FIG. 6d, the thermoplastic resin contained in the base-forming green sheets 2M' softens by the heat (about 90° C.) during the compression. As a result, the base-forming green sheets 2M' will bond to each other by the softened thermoplastic resin to form a base laminate body 2L. The compression force, heating temperature and compression (heating) time of this step may be also suitably varied within the ranges of 150–250kg/cm$^2$, 80–110° C. and 5–30 minutes, respectively. Further, the step of FIG. 6d may be performed prior to or simultaneously with the steps of FIGS. 6a–6c.

Figure 6E:
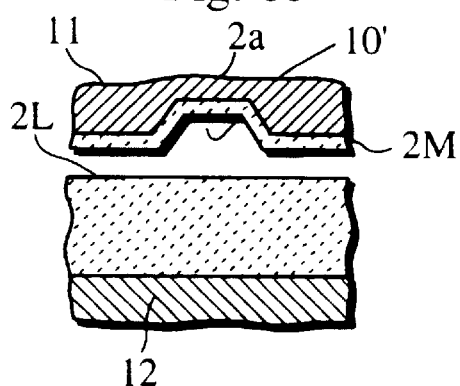

Then, as shown in FIG. 6e, while the base laminate body 2L is kept on the second lower die 12', the second upper die 11' is removed for replacement with the first upper die 11 holding the processed surface green sheet 2M.

Figure 6F:
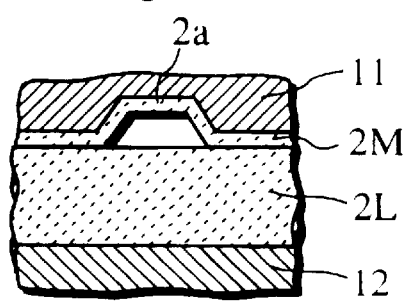

Then, as shown in FIG. 6f, the first upper die 11 is lowered, so that the surface green sheet 2M is laminated on the base laminate body 2L and kept at a temperature of about 90° C. under compression of about 200 kg/cm$^2$ for about 30 minutes. As a result, the surface green sheet 2M and the base laminate body 2L bond to each other due to softening of the thermoplastic resin contained therein. The compression force, heating temperature and compression (heating) time of this step may be also varied suitably within the ranges of 150–250kg/cm$^2$, 80–110° C. and 5–30 minutes, respectively.

Figure 6G:
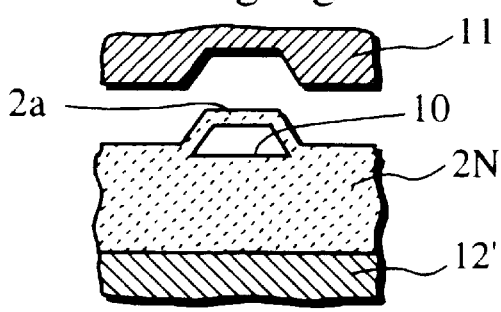

Then, as shown in FIG. 6g, the first upper die 11 is removed to take out the resulting combined laminate body. Thereafter the combined laminate body is put into a baking furnace (not shown) for gradual heating from a room temperature, and baked at a temperature of about 900° C. for about 2 hours before effecting a gradual temperature drop. Through this step, the thermoplastic resin contained in the combined laminate body 2N evaporates and dissipates by thermal decomposition when the temperature rises beyond 500° C., whereas the alumina and glass constituents are partially crystallized at the baking temperature (about 900° C.). As a result, a baked master substrate 2N is obtained which has a plurality of hollow portions 10, in the wall thickness, at the positions of the raised portions 2a and is physically and chemically stable. In this baking step, again, the baking temperature, the baking time and the like may be suitably varied.

In the compression and baking steps described above, the size of the respective green sheets 2M, 2M' will reduce by about 30% in the pressing direction, and by about 13% in a direction which is perpendicular to the pressing direction. Therefore, the initial size of the respective green sheets 2M, 2M' as well as the number of the necessary green sheets should be determined in advance by considering the size contraction and the desired final size of the master substrate 2N.

After forming the master substrate 2N through the above-described steps (FIGS. 6a–6g), a conductive paste containing gold is applied to the upper surface of the master substrate 2N by screen printing, and then baked to form a conductor film (not shown).

Then, the conductor film is etched in a predetermined pattern to form a common electrode 5 and individual electrodes 6 (see FIGS. 1 and 2) in corresponding relationship to respective hollow portions 10 (raised portions 2a).

Then, a resistor paste containing ruthenium oxide is linearly printed in a thick film on the upper surface of the master substrate 2N along each hollow portion 10 (raised portion 2a), and baked to form a heating resistor 3 (FIGS. 1 and 2).

Then, a conventional overcoat glass paste (having a low thermal conductivity) is applied, by screen printing, to the upper surface of the master substrate 2N on both sides of the heating resistor 3, and thereafter baked to form first protective layers 8 (FIGS. 1 and 2) having a thickness of about 4 µm for example.

Then, a glass paste containing a highly thermally conductive substance as a filler is applied, by screen printing, to cover the exposed heating resistor 3, and thereafter baked to form a second protective layer 9 (FIGS. 1 and 2) having a thickness of about 6 μm for example.

Then, the thus treated master substrate 2N is divided along the longitudinal break lines BL1 and the widthwise break lines BL2 (see FIG. 5). As a result, a plurality of individual head substrates 2 (see FIG. 4) are obtained each of which has a homogeneous composition and is internally formed with a strip-like hollow portion 10.

Finally, drive ICs 4 (FIG. 2) are mounted on each individual head substrate 2, and necessary treatments such as wire bonding are performed to provide a desired thermal printhead 1.

Figure 7:
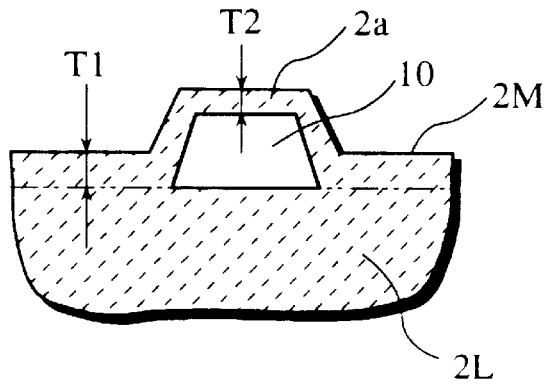
FIG. 7 is a sectional view showing a principal part of a modified version of the substrate of FIG. 4.
Figure 8:
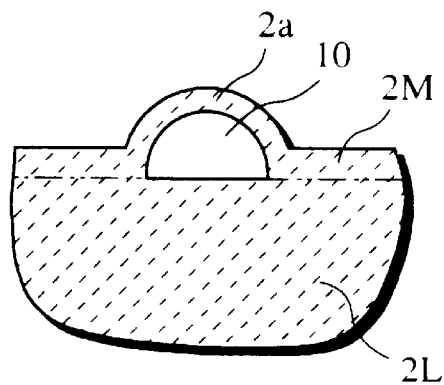
FIG. 8 is a sectional view showing a principal part of another modified version of the substrate of FIG. 4.

According to the method described above, the hollow portion 10 can be easily formed simply by the steps of suitably laminating the two kinds of green sheets 2N, 2N', and then compressing and heating the laminate. Further, the size and configuration of the raised portion 2a and hollow portion 10 can easily be adjusted only by altering the recess 11a of the first upper die 11 and the projection 12a of the first lower die 12 in size and configuration. For example, as shown in FIG. 7, the thickness T2 of the top of the raised portion 2a may be made smaller than the thickness Ti of a portion other than the raised portion 2a in the surface green sheet 2M. Further, as shown in FIG. 8, the raised portion 2a may be formed to have an arcuate cross section so that the hollow portion 10 has a fragmentarily circular cross section.

In the illustrated first embodiment, the respective green sheets 2M, 2M' has an equal thickness. However, the surface green sheet 2M may differ from the base-forming green sheets 2M' in thickness, and the base-forming green sheets 2M' may differ from each other in thickness. By suitably altering the projection amount and width of the raised portion 2a of the surface green sheet 2M in the steps shown in FIGS. 6a–6c, the dimensions of the hollow portion 10 can be varied for adjusting the printing performance as required. Further, the numbers of the non-perforated green sheets 2M' to be included in the base laminate body 2L (FIG. 6d) may also be optional.

Further, in the illustrated first embodiment, the heating resistor 3, the common electrode 5 and the individual electrodes 6 are formed directly on the master substrate 2N (i.e. the individual substrate 2). However, the upper surface of the master substrate 2N may be entirely or partially formed with a glaze layer (not shown) on which the heating resistor 3, the common electrode 5 and the individual electrodes 6 may be formed.

Moreover, in performing the steps shown in FIGS. 6e and 6f, the respective dents 10' of the surface green sheet 2M may be in advance filled with a resin member such as polyvinyl alcohol which evaporates by thermal decomposition at high temperatures of not lower than 500° C. In this way, deformation of the subsequently formed hollow portion 10 can be prevented, which would otherwise occur when the material of the base laminate body 2L is partially forced into the dents 10' under the applied compression force for bonding the surface green sheet 2M to the base laminate body 2L. Further, the resin member fitted in the dents 10' (hollow portions 10a) will evaporate and dissipate by thermal decomposition due to the heat (not lower than 500° C.) to be generated in the latter baking step.

Figure 9:
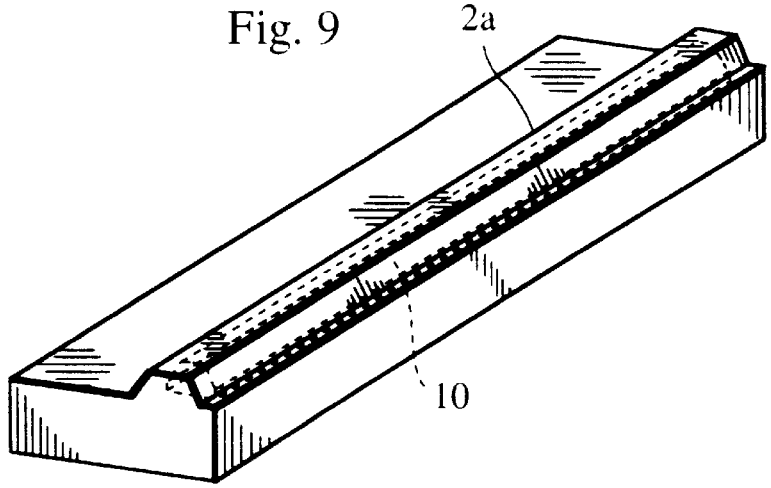
FIG. 9 is a perspective view showing a substrate used for the thermal printhead according to another preferred embodiment of the present invention.
Figure 10:
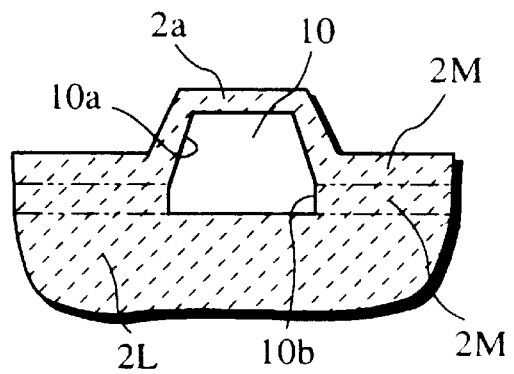
FIG. 10 is a sectional view showing a principal part of the substrate of FIG. 9.

FIGS. 9 and 10 show a head substrate according to a second embodiment of the present invention. The head substrate of the second embodiment is similar to the head substrate of the first embodiment, but differs therefrom in the following two points. First, the head substrate of the second embodiment has a hollow portion 10 which is closed at its both ends. Second, the hollow portion 10 includes an upper region 10a having a trapezoidal cross section and a lower region 10b having a rectangular cross section.

Figure 11:
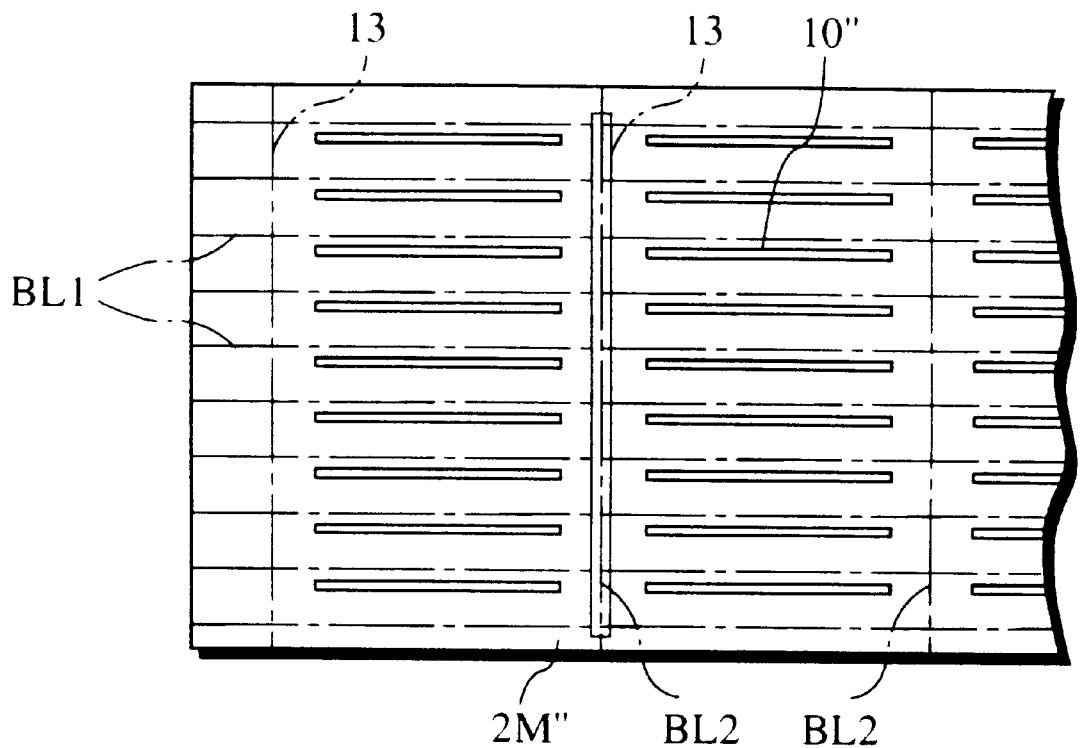
FIG. 11 is a plan view showing a perforated green sheet used for making the substrate of FIG. 9.
Figure 12:
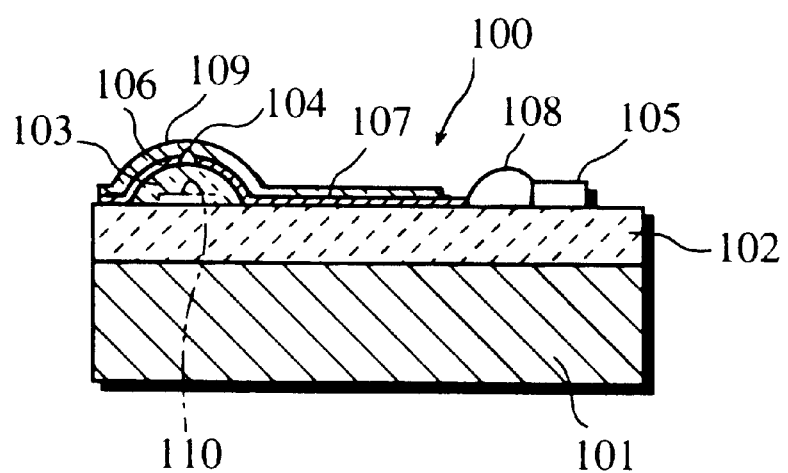
FIG. 12 is a transverse sectional view in the widthwise direction showing a conventional thermal printhead.

The head substrate having the above-described hollow portion 10 can be formed using the already described surface green sheet 2M (FIGS. 5 and 6a) and plural base-forming green sheets 2M' (FIG. 6d), as well as a perforated green sheet 2M" shown in FIG. 11. The perforated green sheet 2M" includes a plurality of sections defined by longitudinal break lines BL1 and widthwise break lines BL2, wherein each section has a slit 10" at a position corresponding to one of the raised portions 2a formed in the surface green sheet 2M. Such a slit 10' may be formed in a penetrated manner by a press for example.

The method for making the head substrate according to the second embodiment is substantially the same as the method for making the head substrate according to the first embodiment, as far as the steps shown in FIGS. 6a–6d are concerned. However, in the steps shown in FIGS. 6e and 6f, the first upper die 11 is lowered for compressing and heating while the perforated green sheet 2M" (see FIG. 11) is kept inserted between the surface green sheet 2M and the base laminate body 2L. Further, at that time, the second lower die 12' may be formed with a strip-like projection for example, so that a greater compression force is applied to a strip-like region 13 along the respective widthwise break lines BL2, as shown in FIG. 11. Thus, upon compression, the material of the perforated green sheet 2M" and base laminate body 2L at the position of the respective strip-like regions 13 is forced into the hollow portions 10 to close the hollow portions 10 at the position corresponding to the strip-like region. As a result, when the master substrate 2N (FIG. 6g) is later divided along the respective break lines BL1 and BL2, both ends of the hollow portion 10 of each head substrate are closed.

According to the above-described second embodiment, the height of the hollow portion 10 is increased by adding a perforated green sheet 2M" in making the head substrate. Thus, it is possible to further reduce the heat which dissipates from the heating resistor (element 3 in FIG. 3) via the head substrate, and to reduce the power consumption and improve the printing quality. Further, by altering the thickness of the perforated green sheet 2M" to be used, the height of the hollow portion 10 can be adjusted for adjusting the printing performance.

Apparently, in the second embodiment illustrated in FIGS. 9–11, the both ends of the hollow portion 10 need not necessarily be closed but may be rendered open, as shown in FIG. 4. Further, the height of the hollow portion 10 can be adjusted by inserting a plurality of perforated green sheets 2M".

The preferred embodiments of the present invention being thus described, the present invention is not limited to these embodiments. Therefore, the present invention can be modified in various ways within the scope of the attached claims.

We claim:

1. A thermal printhead comprising:
    an integral substrate made only of a homogeneous insulating material having a flat mounting surface;
    heating resistor means formed on the substrate to form a plurality of heating dots;
    a conductor pattern formed at least partially on the flat mounting surface of the substrate for electrical connection to the heating resistor means; and driving means mounted on the flat mounting surface of the substrate for selectively heating the heating dots via the conductor pattern;

wherein the substrate has an integral raised portion at a position of the heating resistor means, and the substrate has, in its wall thickness, an elongated hollow portion extending along the heating resistor means at a position of the raised portion, the hollow portion being closed at both ends as viewed in its extending direction, the hollow portion projecting beyond the flat mounting surface of the substrate.

2. The thermal printhead according to claim 1, wherein the raised portion has a trapezoidal cross section.

3. The thermal printhead according to claim 1, wherein the raised portion has an arcuate cross section.

4. The thermal printhead according to claim 1, wherein the hollow portion has an upper region and a lower region both having different cross sections.

5. The thermal printhead according to claim 4, wherein the upper region of the hollow portion has a trapezoidal cross section, whereas the lower region of the hollow portion has a rectangular cross section.

6. The thermal printhead according to claim 1, wherein the substrate is made of homogeneous crystallized glass.

7. The thermal printhead according to claim 6, wherein the substrate is made of a homogeneous mixture of alumina and a glass material.

8. The thermal printhead according to claim 1, wherein the heating resistor means and the conductor pattern are covered by protective means, the protective means having, at a position of the heating resistor means, a higher thermal conductivity than the substrate.

9. The thermal printhead according to claim 8, wherein the protective means comprises first protective layers covering the conductor pattern on both sides of of the heating resistor means and having a lower thermal conductivity, and a second protective layer covering the heating resistor means and having a higher thermal conductivity.

10. The thermal printhead according to claim 9, wherein the second protective layer is made of a material which contains a filler for increasing thermal conductivity.

11. An integral substrate made only of a homogeneous insulating material for a thermal printhead, the substrate having a flat mounting surface, wherein the substrate has, on the flat mounting surface thereof, a longitudinal integral raised portion, and the substrate has, in its wall thickness, an elongated hollow portion extending longitudinally of the raised portion at a position of the raised portion, the hollow portion being closed at both ends as viewed in its extending direction, the hollow portion projecting beyond the flat mounting surface of the substrate.

12. The substrate according to claim 11, wherein the raised portion has a trapezoidal cross section.

13. The substrate according to claim 11, wherein the raised portion has an arcuate cross section.

14. The thermal printhead according to claim 11, wherein the hollow portion has an upper region and a lower region both having different cross sections.

15. The substrate according to claim 14, wherein the upper region of the hollow portion has a trapezoidal cross section, whereas the lower region of the hollow portion has a rectangular cross section.

16. The substrate according to claim 11, wherein the substrate is made of homogeneous crystallized glass.

17. The substrate according to claim 16, wherein the substrate is made of a homogeneous mixture of alumina and a glass material.

* * * * *